(12) United States Patent
Velican et al.

(10) Patent No.: US 10,477,316 B2
(45) Date of Patent: Nov. 12, 2019

(54) AMPLIFIER CIRCUIT FOR IMPROVED SOUND

(71) Applicant: Blueprint Acoustics Pty Ltd, Endeavour Hills (AU)

(72) Inventors: Zeljko Velican, Endeavour Hills (AU); Walter Melville Dower, Narre Warren North (AU)

(73) Assignee: Blueprint Acoustics Pty Ltd (AU)

( * ) Notice: Subject to any disclaimer, the term of this patent is extended or adjusted under 35 U.S.C. 154(b) by 0 days.

(21) Appl. No.: 15/531,796

(22) PCT Filed: Oct. 16, 2015

(86) PCT No.: PCT/AU2015/000626
§ 371 (c)(1),
(2) Date: May 31, 2017

(87) PCT Pub. No.: WO2016/086258
PCT Pub. Date: Jun. 9, 2016

(65) Prior Publication Data
US 2017/0272862 A1    Sep. 21, 2017

(30) Foreign Application Priority Data

Dec. 1, 2014 (AU) .............................. 2014904856

(51) Int. Cl.
H03B 5/12 (2006.01)
H03F 1/08 (2006.01)
H04R 3/14 (2006.01)
H03F 1/32 (2006.01)
H03F 3/187 (2006.01)
H03F 3/213 (2006.01)

(52) U.S. Cl.
CPC ................. *H04R 3/14* (2013.01); *H03F 1/32* (2013.01); *H03F 3/187* (2013.01); *H03F 3/213* (2013.01); H03F 2200/03 (2013.01)

(58) Field of Classification Search
CPC ..... H04R 3/14; H03F 3/68; H03F 1/08; H03F 1/32; H03F 3/187; H03F 3/213; H03F 2200/03; H04B 1/1018; H03B 5/1221
USPC .......................................... 381/100, 120, 28
See application file for complete search history.

(56) References Cited

U.S. PATENT DOCUMENTS 4,597,100 A * 6/1986 Grodinsky ............... H04R 3/14
                                                          381/99
5,302,917 A * 4/1994 Concorso .............. H03F 3/3001
                                                          330/264

(Continued)

OTHER PUBLICATIONS

International Search Report for Application No. PCT/AU2015/000626 dated Nov. 9, 2015.

*Primary Examiner* — Vivian C Chin
*Assistant Examiner* — Ubachukwu A Odunukwe
(74) *Attorney, Agent, or Firm* — Lerner, David, Littenberg, Krumholz & Mentlik, LLP

(57) ABSTRACT

An amplifier circuit is disclosed suitable for feeding a loudspeaker system having plural drivers. The amplifier circuit has an output stage and plural output connectors such that there is an output connector for each driver, wherein the output stage is connected separately to each output connector for independent connection to each driver. A method of feeding a loudspeaker system having plural drivers with an amplifier circuit having an output stage is also disclosed.

18 Claims, 3 Drawing Sheets

(56) References Cited

U.S. PATENT DOCUMENTS

| | | | |
|---|---|---|---|
| 5,399,986 A * | 3/1995 | Yen | H03F 3/68 330/124 R |
| 5,796,305 A | 8/1998 | Sondermeyer | |
| 5,875,250 A * | 2/1999 | Kuo | H03F 3/3061 381/120 |
| 7,688,147 B1 * | 3/2010 | Hoover | H03F 3/187 330/258 |
| 2008/0174368 A1 * | 7/2008 | Chattin | H03F 1/52 330/263 |
| 2012/0257771 A1 | 10/2012 | Bai et al. | |

* cited by examiner

AMPLIFIER CIRCUIT FOR IMPROVED SOUND

CROSS REFERENCE TO RELATED APPLICATIONS

The present application is a national phase entry under 35 U.S.C. § 371 of International Application No. PCT/AU2015/000626 filed Oct. 16, 2015, published in English, which claims priority from Australian Patent Application No. 2014904856, filed Dec. 1, 2014, all of which are incorporated herein by reference.

TECHNICAL FIELD

The present invention relates to an amplifier circuit suitable for audio applications and in particular relates to an amplifier circuit for improved sound quality.

DEFINITIONS

In this specification "amplifier" refers to a single audio power amplifier (i.e. one channel) and includes an electronic amplifier circuit and any peripheral apparatus associated with the amplifier in a consumer packaged form, including power supplies, protection devices, signal conditioning, switches, potentiometers, connectors and a case or enclosure. However it excludes other amplifier circuits that may be included in the same case or enclosure. Thus in the case of a stereo amplifier product, in this context there are two "amplifiers" to which the present invention may be applied.

In this specification the "controlled output" of an amplifier denotes the final output amplification stage. Typically it is the point in an amplifier circuit where an output feedback loop commences. Accordingly this specification may use the terms "controlled output" and "feedback point" interchangeably.

In this specification "passive loudspeaker system" refers to a loudspeaker system comprising more than one loudspeaker driver fed by a single amplifier and may include passive filter components.

BACKGROUND OF INVENTION

In multi-band loudspeaker systems it is often observed that passive loudspeaker systems lack the sound quality of bi-amped or active loudspeaker systems. It is sometimes also observed that very low impedance loudspeaker cables provide an improvement in sound quality. Many theories are advanced as to why these results occur and in fact it is not uncommon to see engineers attempt to debunk these claims for theoretical reasons without seeing a need to perform a listening test.

However loudspeaker drivers in passive multi-band systems are not "firmly" connected to the low output impedance "controlled output" or feedback point of the amplifier. Instead the drivers are isolated from the controlled output or feedback point to some degree by various impedances, including the loudspeaker cable impedance and the impedance of a damping output inductor. Even when the drivers are connected in a bi-wired arrangement there is still a damping output inductor partially isolating the controlled output of an amplifier from the loudspeaker drivers. The damping output inductor or at least the impedance associated with the damping inductor is one reason why bi-wired configurations do not sound as clean as bi-amped configurations.

In passive systems all drivers connected to a single amplifier act as loads for the back EMF of all other drivers connected to the single amplifier regardless of any electrical filtering interconnecting the drivers. This is especially the case where there are no electrical filters or where the filters are of low order. If the loudspeaker drivers were firmly tied to a controlled output having a low output impedance, driver interaction would be negligible. However in consumer packaged amplifiers they rarely are firmly tied because damping output inductors and/or other components are typically present between the controlled output or feedback point and the amplifier terminals.

Typically in a passive system, the damping output inductor or equivalent circuitry in the amplifier and cable impedances isolate the controlled output or feedback point from a branching point to individual loudspeaker drivers so that back EMF from drivers results in circulating currents between drivers causing audible corruption of the sound produced.

A reference herein to a patent document or other matter which is given as prior art is not to be taken as an admission that that document or matter was known or that the information it contains was part of the common general knowledge in Australia or elsewhere as at the priority date of any of the disclosure or claims herein. Such discussion of prior art in this specification is included to explain the context of the present invention in terms of the inventor's knowledge and experience.

Throughout the description and claims of this specification the words "comprise" or "include" and variations of those words, such as "comprises", "includes" and "comprising" or "including, are not intended to exclude other additives, components, integers or steps.

SUMMARY OF INVENTION

According to one aspect of the present invention there is provided an amplifier circuit suitable for feeding a loudspeaker system having plural drivers, said amplifier circuit having an output stage and plural output connectors such that there is an output connector for each driver, wherein said output stage is connected separately to each output connector for independent connection to each driver.

The amplifier circuit may include an independent damping output inductor and/or other components or circuits that add an impedance between the output stage and each output connector. Other components may include a common mode filter. Each damping output inductor may comprise an air cored inductor in parallel with a damping resistor. Each damping output inductor may include a circuit that terminates at the respective output connector. Values of each damping output inductor may be determined to suit the respective frequency band served by the respective driver. In some embodiments, values for all damping output inductors may be identical. Each output connector may be labelled with one of the following names: tweeter, midrange, woofer and/or translations thereof into other languages. In some embodiments, the amplifier circuit may be embedded in an integrated circuit package.

According to a further aspect of the present invention there is provided a method of feeding a loudspeaker system having plural drivers with an amplifier circuit having an output stage, said method comprising providing said amplifier circuit with plural output connectors such that there is an output connector for each driver, and separately connecting said output stage to each output connector for independent connection to each driver.

The present invention may allow the bi-wiring principle to be extended to the feedback point of an amplifier containing a multiple output filter. It may be implemented as forked outputs commoned at the feedback point to ensure that current flowing through an output damping inductor is substantially the same current flowing into the loudspeaker driver to which it is connected. It may improve sound quality in the same way as bi-amping does but without the expense of additional amplifiers.

BRIEF DESCRIPTION OF DRAWINGS

A preferred embodiment of the present invention will now be described in detail with reference to the following diagrams wherein.

DETAILED DESCRIPTION

Figure 1:
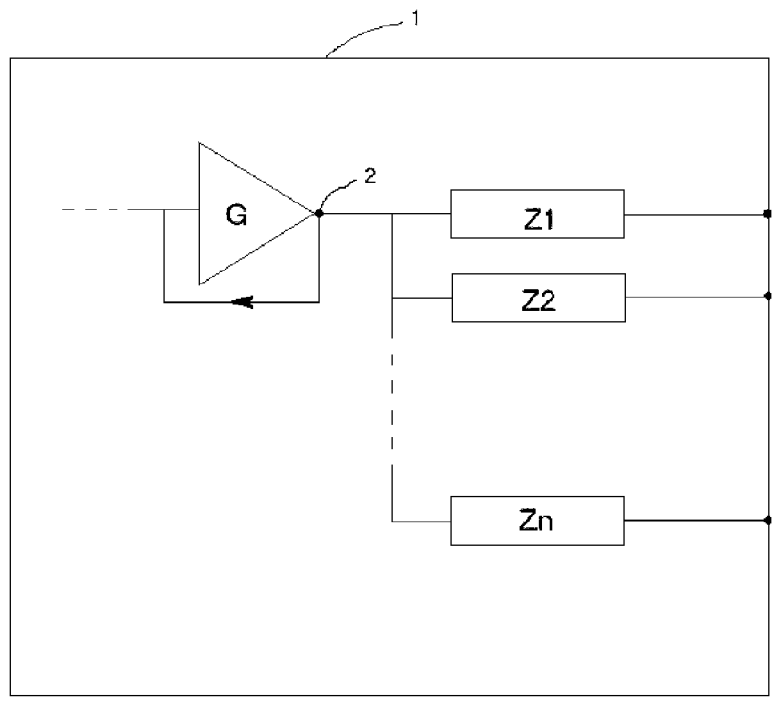
FIG. 1 shows a schematic representation of an amplifier according to the present invention.

FIG. 1 shows an overview of the present invention in schematic form. Amplifier 1 contains an amplifier circuit G with feedback originating from feedback point 2. Output impedances Z1 to Zn, which may vary from each other, represent independent damping output inductors and include any other circuitry added to the output of amplifier G past feedback point 2 for feeding a load such as loudspeaker drivers 22, 23 as shown in FIG. 2, connected to amplifier G.

Figure 2:
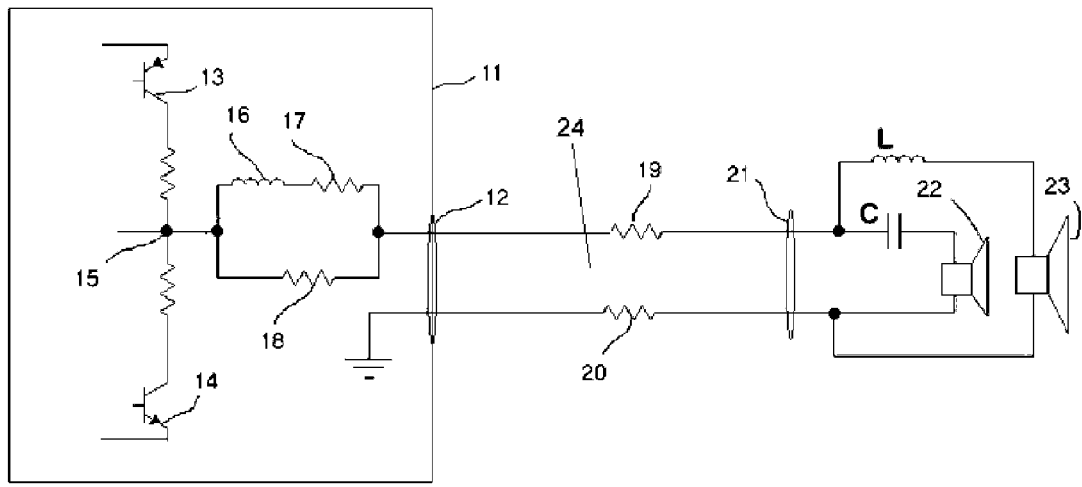
FIG. 2 shows a typical prior art passive multi-band loudspeaker system.

FIG. 2 shows an amplifier 11 in a common prior art configuration including connector 12 which may comprise a pair of binding posts or a connector socket. Internal to amplifier 11 is a pair of active output devices comprising bipolar devices 13, 14. Bipolar devices 13, 14 are exemplified for illustrative purposes only, but serve to identify the controlled output or feedback point 15 of amplifier 11 from which a feedback signal is typically taken. In the forward direction a damping output inductor is shown comprising an idealised inductor 16, having internal resistance 17 and damping resistor 18 in parallel. The damping resistor 18 is relatively large by comparison and may be of no consequence.

Beyond amplifier 11 is a loudspeaker cable 24 with total resistance including the sum of resistances 19 and 20. Cable 24 terminates at connector 21 which may include binding posts or connector sockets. For illustrative purposes, filtering of the signal at loudspeaker drivers 22, 23 is performed via a capacitor C feeding tweeter 22 and inductor L feeding woofer 23. In some instances the filtering may be significantly more complex. In the example of FIG. 2 the number of loudspeaker drivers and associated frequency bands is shown as two but in general may be more than two.

In any event it may be seen that the controlled output or feedback point 15 of amplifier 11 is isolated from loudspeaker drivers 22, 23 by the damping output inductor represented by idealised inductor 16 and resistance 17 as well as the resistances 19, 20 of cable 24, but loudspeaker drivers 22, 23 are relatively directly connected and can interact electrically with each other. In particular the back EMF of each driver 22, 23 is to some extent cycled through the other driver giving rise to both harmonic and non-harmonic distortion. For discerning listeners seeking a clean sound from amplifier 11 with a relatively low level of distortion (e.g. 0.01% or better), this prior art configuration cannot come close to providing it.

Figure 3:
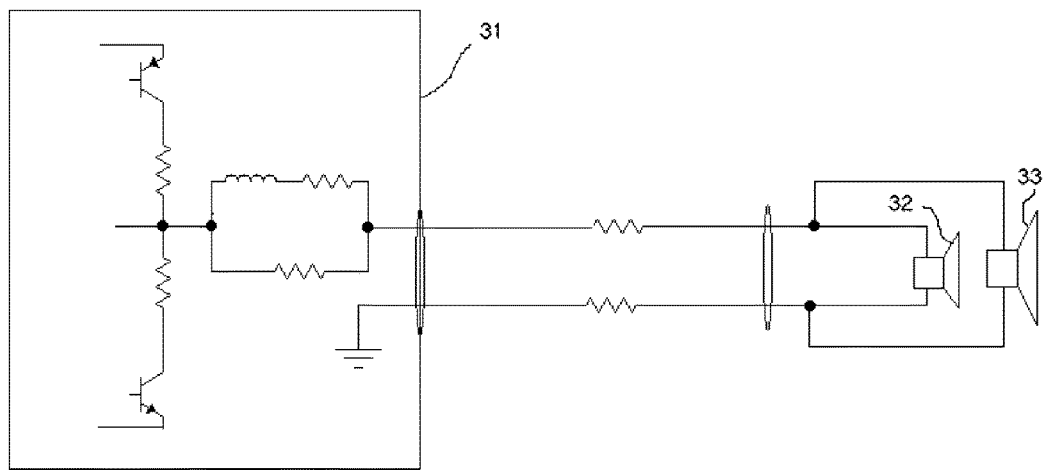
FIG. 3 shows a typical prior art passive multi-driver loudspeaker system.

FIG. 3 shows another prior art configuration with a single amplifier 31 feeding two different drivers 32, 33 operating in the same frequency band. In the example of FIG. 3 two drivers are shown for illustrative purposes, but in general the number of drivers may be higher. Nevertheless the same problems arise as for the amplifier in FIG. 2 and for the same reasons the configuration of FIG. 3 may result in corruption of sound unless the drivers are identical.

Figure 4:
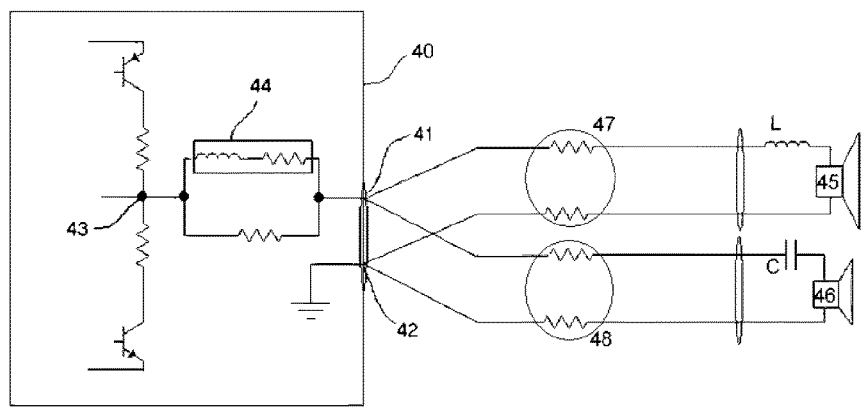
FIG. 4 shows a prior art bi-wired passive loudspeaker system.

FIG. 4 shows another prior art configuration with a single amplifier 40 feeding a bi-wired passive loudspeaker system comprising drivers 45, 46. The filtering shown is for representative purposes only and may differ from that shown in FIG. 4. As may be seen there is now more resistance between loudspeaker drivers 45, 46 than in FIGS. 2 and 3, but less resistance between the common output point 41 of the circuit and the controlled output or feedback point 43. Accordingly currents circulating between loudspeaker drivers 45, 46 are now impeded by cable resistances 47-48, and the controlled output 43 has more control over the common output point 41 of the circuit. Nevertheless that control is substantially weakened by damping output inductor 44 and the configuration of FIG. 4 still cannot deliver clean sound.

Figure 5:
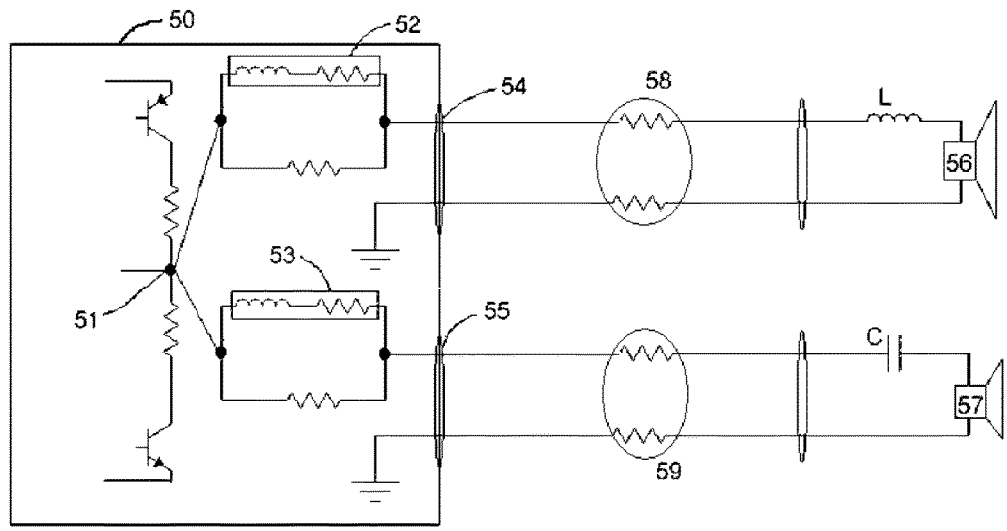
FIG. 5 shows a passive loudspeaker system according to the present invention.

FIG. 5 shows an amplifier 50 feeding a passive loudspeaker system comprising drivers 56, 57 wherein amplifier 50 is configured according to the present invention. As in FIG. 4 the filtering shown in FIG. 5 is generic and for representative purposes only. In particular amplifier 50 is configured such that controlled output 51 of amplifier 50 feeds loudspeaker drivers 56 (woofer), and 57 (tweeter) via separate damping output inductors 52, 53 and via a separate set of output posts or sockets 54 and 55. The separate set of output posts or sockets 54, 55 are connected via separate cables 58, 59 to the respective loudspeaker drivers 56, 57. Accordingly circulating currents between loudspeaker drivers 56, 57 are substantially eliminated and the controlled output 51 of amplifier 50 substantially directly controls the current to each loudspeaker driver 56, 57. This arrangement may be suitable for any passive multi-driver loudspeaker system and may provide relatively cleaner sound.

Figure 6:
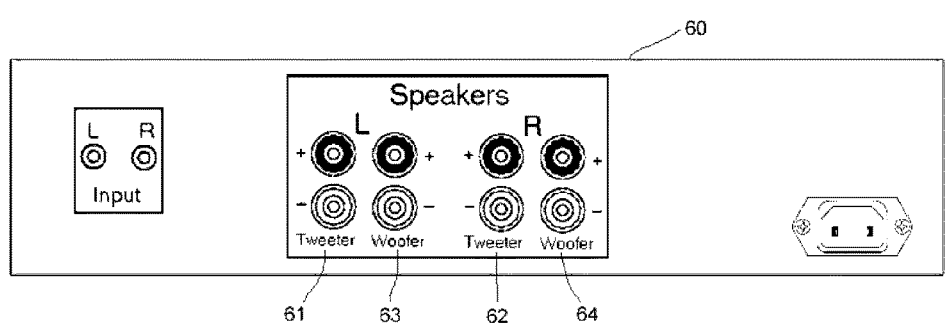
FIG. 6 shows a representative back panel for the amplifier of FIG. 5.

FIG. 6 shows a representative stereo amplifier back panel 60 including the configuration of FIG. 5. Back panel 60 includes stereo (left and right channel) outputs for a two way passive loudspeaker system, including two tweeter outputs 61, 62 and two woofer outputs 63, 64.

In particular the configuration in amplifier 50 replaces a single damping output inductor as in FIGS. 2 to 4 with separate damping output inductors 52, 53 for each electrical circuit feeding a respective driver 56, 57. FIGS. 5 and 6 show a configuration adapted for a loudspeaker system having two frequency bands including a tweeter and a woofer. Nevertheless, the principles of the present invention may also be applied to loudspeaker systems having three or more frequency bands.

The damping output inductors 52, 53 may be formed from an air-cored coil in parallel with a damping resistor and the associated circuits may be terminated at respective output posts or sockets 54, 55. The damping output inductors are representative only and alternative circuits may include transformers, shunt components, protection devices, common mode filters, and the like.

The inductors 52, 53 may optionally have different values to suit the different frequency bands and may be labelled tweeter and woofer or translations hereof in the case of a two band system. In the case of a three band loudspeaker system, three damping output inductors may be used to feed a tweeter, midrange driver and woofer respectively via separate output posts or sockets.

In a further embodiment an amplifier circuit according to the present invention may be embedded via in an integrated circuit package wherein multiple damping output inductors are also embedded and their respective circuits terminate via separate output pins.

Care should be taken to avoid crosstalk between the respective output damping inductors. This may be done e.g. by (a) separation, (b) shielding and/or (c) orthogonal placement. However a preferred method may be to wind the damping inductors as toroids and to mount them vertically. Care should also be taken to avoid crosstalk between the damping inductors of different amplifier channels of multi-channel amplifiers such as stereo and/or surround amplifiers.

Finally, it is to be understood that various alterations, modifications and/or additions may be introduced into the constructions and arrangements of parts previously described without departing from the spirit or ambit of the invention.

The invention claimed is:

1. An amplifier circuit in a single audio power amplifier suitable for feeding a loudspeaker system having plural drivers, said amplifier circuit having:
    a) a final output amplification stage with a low output impedance controlled output and
    b) plural output connectors such that there is an output connector for each driver, wherein said low output impedance controlled output of the final output amplification stage is connected separately to each output connector of the audio power amplifier via a separate damping output inductor for independent connection to each driver.

2. An amplifier circuit according to claim 1 wherein each damping output inductor comprises an air cored inductor in parallel with a damping resistor.

3. An amplifier circuit according to claim 1 wherein each damping output inductor includes a circuit that terminates at the respective output connector.

4. An amplifier circuit according to claim 3 wherein each output connector is labelled with one of the following names: tweeter, midrange, woofer and/or translations thereof into other languages.

5. An amplifier circuit according to claims 1 wherein a value of each damping output inductor is determined to suit the respective frequency band served by the respective driver.

6. An amplifier circuit according to claim 1 wherein values for all damping output inductors is identical.

7. An amplifier circuit according to claim 1 when embedded in an integrated circuit package.

8. A method of feeding a loudspeaker system having plural drivers with an amplifier circuit in a single audio power amplifier, said amplifier circuit having a final output amplification stage with a low output impedance controlled output, said method comprising:
    providing said amplifier circuit with plural output connectors such that there is an output connector for each driver; and
    separately connecting said low output impedance controlled output of the final output amplification stage to each output connector of the audio power amplifier for independent connection via a separate damping output inductor to each driver.

9. A method according to claim 8 wherein each damping output inductor comprises an air cored inductor in parallel with a damping resistor.

10. A method according to claim 8 wherein each damping output inductor includes a circuit that terminates at the respective output connector.

11. A method according to claim 10 wherein each output connector is labelled with one of the following names: tweeter, midrange, woofer and/or translations thereof into other languages.

12. A method according to claims 8 wherein a value of each damping output inductor is determined to suit the respective frequency band served by the respective driver.

13. A method according to claim 8 wherein values for all damping output inductors is identical.

14. An amplifier circuit configured to feed a plurality of drivers of a loudspeaker system, the amplifier circuit comprising:
    a single output amplification stage configured to output a controlled output having a low output impedance;
    a plurality of output connectors, each output connector configured to connect to a respective driver of the loudspeaker system via a separate cable;
    a plurality of damping output inductor circuits having a one-to-one correspondence to the plurality of output connectors, each damping output inductor circuit being connected to a corresponding output connector, wherein each damping output inductor circuit is connected to the single output amplification stage via a respective connection, and wherein the respective connections between the single output amplification stage and the damping output inductor circuits are separate from one another.

15. An amplifier circuit according to claim 14, wherein the plurality of damping output inductor circuits are positioned in the amplifier circuit relative to one another to avoid electrical crosstalk between the drivers.

16. An amplifier circuit according to claim 15, wherein the plurality of damping output inductor circuits are positioned in the amplifier circuit orthogonally to one another to avoid electrical crosstalk between the damping output inductor circuits.

17. An amplifier circuit according to claim 15, wherein the plurality of damping output inductor circuits are positioned in the amplifier circuit with shielding in between to avoid electrical crosstalk between the damping output inductor circuits.

18. An amplifier circuit according to claim 15, wherein the plurality of damping output inductor circuits are positioned in the amplifier circuit apart from one another at a distance that avoids electrical crosstalk between the damping output inductor circuits.

* * * * *